United States Patent
Wojnarowski et al.

[11] Patent Number: 5,900,674
[45] Date of Patent: May 4, 1999

[54] INTERFACE STRUCTURES FOR ELECTRONIC DEVICES

[75] Inventors: Robert John Wojnarowski, Ballston Lake; Barry Scott Whitmore, Waterford, both of N.Y.

[73] Assignee: General Electric Company, Schenectady, N.Y.

[21] Appl. No.: 08/781,972

[22] Filed: Dec. 23, 1996

[51] Int. Cl.$^6$ .......................... H01L 23/498; H01L 23/40
[52] U.S. Cl. .............................. 257/774; 29/829; 29/832; 156/155; 156/327; 156/345; 216/13; 216/17; 216/56; 216/65; 216/72; 361/768; 361/774; 361/795; 438/107; 438/118; 438/125; 438/598; 438/940
[58] Field of Search ..................... 29/829, 832; 156/155, 156/327, 345; 216/13, 17, 56, 65, 72; 361/768, 774, 795; 438/107, 118, 125, 598, 940; 428/901, 416, 418, 458, 422, 424.8, 425.5, 425.8, 462, 463, 465; 257/507, 669, 774, 776, 777, 778

[56] References Cited

U.S. PATENT DOCUMENTS

| | | | |
|---|---|---|---|
| 4,641,222 | 2/1987 | Derfiny et al. | 361/403 |
| 4,835,704 | 5/1989 | Eichelberger et al. | 364/490 |
| 4,894,115 | 1/1990 | Eichelberger et al. | 156/643 |
| 5,161,093 | 11/1992 | Gorczyca et al. | 361/414 |
| 5,449,427 | 9/1995 | Wojnarowski et al. | 156/155 |
| 5,454,904 | 10/1995 | Ghezzo et al. | 216/13 |
| 5,527,741 | 6/1996 | Cole et al. | 437/209 |

*Primary Examiner*—Frederick Krass
*Attorney, Agent, or Firm*—Ann M. Agosti; Marvin Snyder

[57] ABSTRACT

An interface includes a surface having an electrically conductive pad; a compliant coating over the surface having a via extending to the pad; metallization patterned over the compliant coating and extending into the via; a low modulus dielectric interface layer overlying the compliant coating and having an interface via extending to the metallization; and a floating pad structure including floating pad metallization patterned over the dielectric interface layer with a first portion forming a central pad and a second portion forming an extension from the central pad extending into the interface via. Another interface includes a substrate including a low modulus dielectric interface material having a hole extending at least partially therethrough and a floating contact structure including electrically conductive material coating the hole with at least some of the floating pad metallization forming an extension from the hole. A conductive contact area interface may include an electrically conductive first contact area; an electrically conductive second contact area facing and being substantially aligned with the first contact area; and at least one interface structure coupled between the first and second contact areas and including an electrical conductor having a partially open interior to form a compliant joint between the first and second contact areas.

28 Claims, 12 Drawing Sheets

INTERFACE STRUCTURES FOR ELECTRONIC DEVICES

BACKGROUND OF THE INVENTION

Ball grid array (BGA) technology provides a high density of interconnections per unit area, but mismatches of coefficients of thermal expansion (CTEs) occur when ceramic or polymer BGA substrates and printed circuit boards are joined and often result in cracked solder joints, especially as the size of the substrates and temperature ranges are increased. In column grid array (CGA) techniques and other BGA techniques, a eutectic solder is applied to printed circuit board and multi-chip module array pads and the resulting joint is soldered to a higher temperature solder column or ball which does not melt. Both BGA and CGA structures can be inflexible and vulnerable to damage. For various types of BGA and CGA, increases in reliability are attempted by elaborate under-filling of the structures with polymer glues to reinforce the interfaces and reduce the effects of the CTE mismatch on the solder joints. The polymer glues, however, impair repairability because of the difficulty in removing the glues after hardening. Furthermore, these types of structures require two separate solder steps, are more expensive than conventional solder structures, and require more vertical space due to increased height of the joints.

One conventional micro ball grid array interface technique for attaching a semiconductor circuit chip directly to a substrate is to use a series of solder bumps clustered at the center of the chip to constrain the area over which stresses between differing coefficients of thermal expansion occur. In this embodiment, chips have their pads reconfigured and solder micro bumps are applied over the reconfigured pads. In one embodiment, ball grid array processes are used with the temperature range being constrained during device operation to 30° C. to 70° C. in an effort to avoid CTE stress effects. In another ball grid array interface technique, the area where the chip faces the printed circuit board or substrate is not used for direct interconnection. Instead, metallization is routed from the chip to adjacent support structures which then have solder ball connections. This technique can create size and pin count limitations as well as electrical parasitic effects.

SUMMARY OF THE INVENTION

It would be desirable to have a method for providing highly compliant electrically conductive interconnections for structures having differing coefficients of thermal expansion and to have a base pad and metallization contact area with long term reliability (i.e. without cracks or breaks) even under thermal and material stress conditions without the need for rerouting chip pads to the center of a chip or to an adjacent support structure.

In one embodiment of the present invention, a method and structure electrically interconnect materials having different coefficients of thermal expansion. A "floating pad" structure is used to increase reliability by providing stress and thermal accommodation of the two materials and permitting movement of the floating pad independent of the base pad. The invention includes a floating pad interface structure that is connected to a semiconductor chip's original pad by means of micro extensions that provide stress relief for different coefficients of thermal expansion. The floating pad interface structures can include a single pad and extension or several extensions in situations wherein a single extension is not sufficient for extreme thermal stress/strain situations. The present invention provides a structure that accommodates thermal and material stresses without submitting the via interconnect areas to forces that can crack vias or break connections at the chip pads. The floating pads permit movement independent of a semiconductor while providing electrical interconnections through selected materials that are specifically patterned to provide low forces at the via areas and thus accommodate differential thermal stresses which may be caused by large CTE differences.

In another embodiment of the present invention a micro structure interface is provided that is solderable and forms an electronic interconnection without requiring pressure. The interconnections can be held in position prior to application by an interposer that provides ease of assembly and surface mount technology self-alignment capability. A conductive contact area interface may comprise: at least one electrically conductive first contact area; at least one electrically conductive second contact area facing and being substantially aligned with the at least one first contact area; and at least one interface structure coupled between the at least one first contact area and the at least one second contact area. The at least one interface structure comprises at least one electrical conductor having a partially open interior to form a compliant joint between the at least one first contact area and the at least one second contact area.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

DETAILED DESCRIPTION OF THE INVENTION

Figure 1:
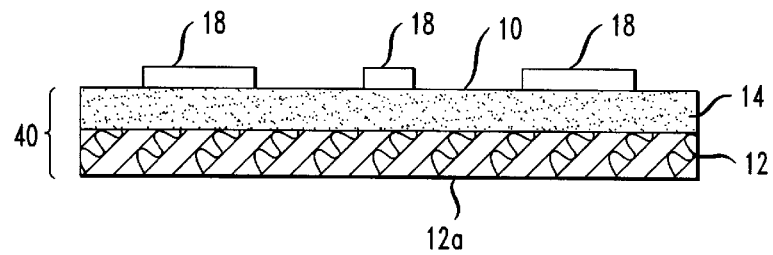
FIG. 1 is a sectional side view of a compliant coating overlying a base pad.

FIG. 1 is a sectional side view of a compliant coating 14 overlying a base surface 10 having conductive pads 12. The base surface may comprise a semiconductor wafer that has not yet been cut into segmented individual chips or a chip which has been segmented from a wafer. Processing on a wafer that has not yet been segmented enables mass fabrication of interface structures and prevents single chip handling problems such as corner edge separations of the compliant coating and alignment difficulties associated with single die handling for photolithographic processing. The base surface may alternatively comprise, for example, a passive component, a printed circuit (PC) board, a multichip module (MCM), a flexible interconnect layer structure such as described in Cole et al., U.S. Pat. No. 5,527,741, Jun. 18, 1996, or a substrate or wafer including photonic structures, liquid crystal structures, or microelectromechanical structures (MEMS) such as described in commonly assigned Ghezzo et al., U.S. Pat. No. 5,454,904, issued Oct. 3, 1995, for example. MEMS and photonic devices can be directly integrated into wafer processing steps to create an integrated structure, or MEMS can be used to fabricate a separate structure which can be later added to the wafer. Conductive pads 12 may comprise pads or metallization on any of the above-discussed base surfaces. With the present invention, interface connections for conductive pads are more stable, so the conductive pads can have smaller areas (such as a diameter or length ranging from about one mil to about four mils) than conventional pads.

Compliant coating 14 comprises a material such as a polyimide or a siloxane polyimide epoxy (SPI/epoxy) described by Gorczyca et al., U.S. Pat. No. 5,161,093, issued Nov. 3, 1992. The compliant coating may comprise a high or low modulus insulative material and typically has a thickness ranging from about two micrometers to about 100 micrometers. The compliant coating can be laminated onto base surface 10 with heat and/or an adhesive (not shown) or deposited on the base surface by a spin, spray, or chemical vapor deposition (CVD) technique, for example.

Coating vias 16 are formed in compliant coating 14 by any appropriate method. In one embodiment, as described in Eichelberger et al., U.S. Pat. No. 4,894,115, issued Jan. 16, 1990, the compliant coating can be scanned repeatedly with a high energy continuous wave laser to create via holes of desired size and shape. Other appropriate methods include, for example, photopatterning photopatternable polyimides and using an excimer laser with a mask (not shown).

Base metallization 18 can be formed by sputtering and/or plating, for example, and patterned with a standard photoresist and etch process. Eichelberger et al., U.S. Pat. No. 4,835,704, issued May 30, 1989, describes a useful adaptive lithography system for patterning the metallization, for example. The base metallization in one embodiment comprises a thin adhesion layer of 1000 Å sputtered titanium, coated by a thin layer of 3000 Å sputtered copper, coated by a layer of electroplated copper to a thickness of four microns, for example. An optional buffer layer of 1000 Å of titanium can be applied over the electroplated copper. Other example base metallization materials include molybdenum, tungsten, and gold. The appropriate material of the base metallization will vary depending on the material of the base surface and on the environment, such as a high temperature environment or an oxidizing environment for example, in which the electronic device will be used.

Figure 2:
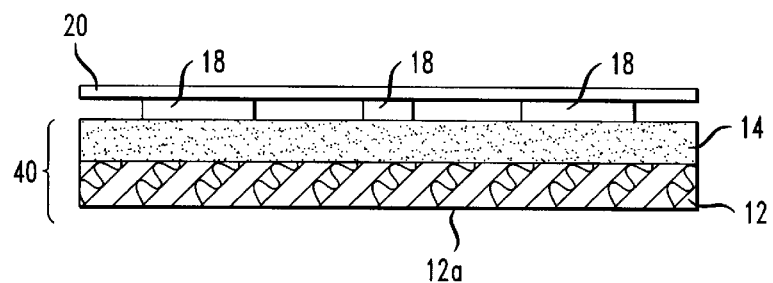
FIG. 2 is a view similar to that of FIG. 1 further including a first interface dielectric layer.

FIG. 2 is a view similar to that of FIG. 1 further including a first interface dielectric layer 20 which preferably comprises a flexible low modulus material, such as SPI/epoxy, other flexible epoxies, silicone rubber materials, TEFLON™ polytetrafluoroethylene (TEFLON is a trademark of E.I. du Pont de Nemours and Co.), or other polymers that have a low modulus or have been modified to obtain reduced modulus, having a thickness ranging from about two micrometers to about 3 mils. A preferred thickness range is from about 100 micrometers to about 400 micrometers.

First interface dielectric layer 20 has vias 22 therein extending to portions of base metallization 18 overlying compliant coating 14. Vias 22 of FIG. 2 can be formed in a similar manner as vias 16 of FIG. 1. If the first interface dielectric layer has a thickness less than that of the compliant coating, vias 22 can be made smaller than vias 16, as shown.

Figure 3:
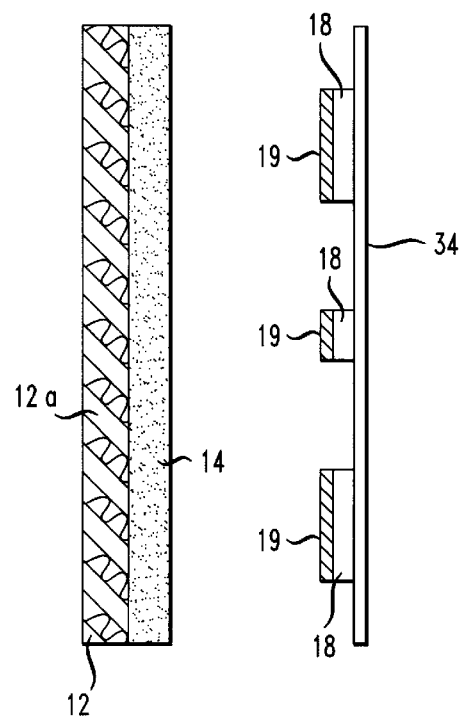
FIG. 3a is a view similar to that of FIG. 2 further including floating pad structures overlying the first interface dielectric layer.
FIG. 3b is a view similar to that of FIG. 3a further showing the removal of the first interface dielectric layer.
Figure 4:
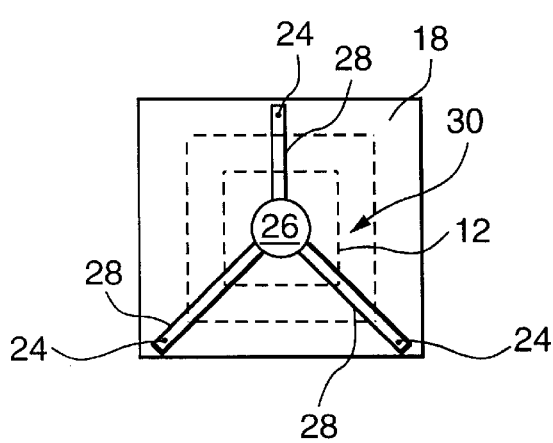
FIG. 4 is a top view of one of patterned floating pad structures overlying the base pad.

FIG. 3a is a view similar to that of FIG. 2 further including floating pad structures 30 and 30a overlying first interface dielectric layer 20, and FIG. 4 is a top view of one of the floating pad structures 30 overlying the base pad. The floating pad structures accommodate thermal and material stresses without imposing undesirable forces on base metallization areas.

Metallization for floating pad structures 30 can be applied and patterned by techniques similar to those discussed with respect to base metallization 18 of FIG. 1. In FIG. 4, the floating pad structures include a central pad 26 having patterned extensions 28 extending through via metallization 24 to base metallization 18.

The size of central pads 26 will vary according to the specific planned use of the floating pad structure. For example, if a solder ball or solder bump will be attached directly to the central pad, the central pad must be large enough to accommodate the attachment. The size of the central pad will also affect the length of extensions. Smaller diameter central pads require less space than larger diameter pads and therefore leave more space for longer extensions. The area of base metallization 18 is an additional factor which can affect the available length of extensions.

The thickness of metallization for the floating pad structures can be uniform, as shown by floating pad structure 30, or variable, as shown by floating pad structure 30a. A modified central pad 26a in FIG. 3a includes central pad 26 and an additional metallization area 27. In one embodiment, the extensions 28 have a thickness ranging from about 2 microns to about 8 microns, and the modified central pad 26a has a thickness ranging from about 4 microns to about 20 microns. This embodiment is useful because thin extensions are more flexible than thicker extensions whereas the central pad is preferably sufficiently thick to be solderable to another electrically conductive surface. In one embodiment the additional metallization area comprises a metal which is readily solderable such as a nickel-gold plate, for example.

Figure 3B:
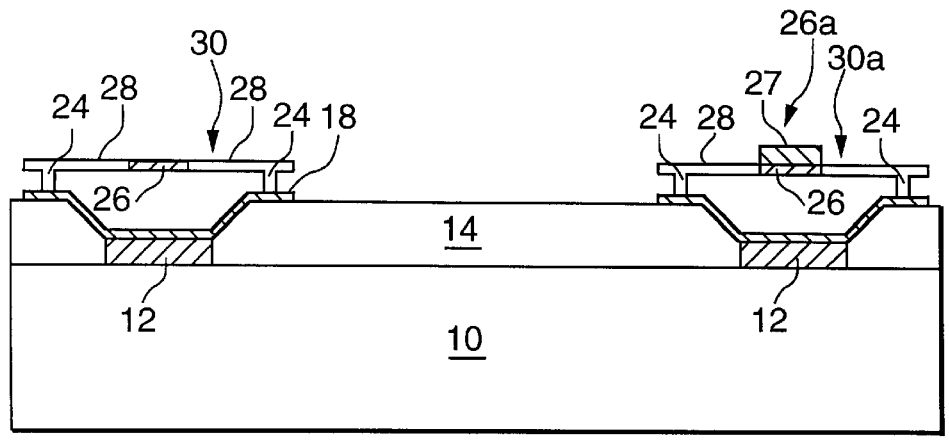

FIG. 3b is a view similar to that of FIG. 3a further showing the removal of the first interface dielectric layer. In some embodiments such as MEMS, for example, removal of first interface dielectric layer 20 is desirable so that the first interface dielectric layer does not impede the movement of MEMS devices or interfere with optical devices. Removing the first interface dielectric layer is also useful because it provides opportunities to fabricate structures having movement that can be used for measurement or control purposes. In these embodiments, the material of first interface dielectric layer 20 is chosen to be a material that can be removed by a sublimation process, a solvent, or a laser, for example, without interfering with compliant coating 14.

In a related embodiment at least a portion of each area 20a under a respective floating pad structure of FIG. 3a can be removed with the remainder of interface dielectric layer 20 being left in position. If desired, the first interface dielectric layer may comprise a photosensitive material that is sensitized in regions other than in the pad regions and can thus be easily removed from under the floating pad interfaces. This embodiment provides a capability of inserting an application specific filler material (which can be solid or fluid) under the floating pad interface in areas 20a to provide special dampening (vibration) control or thermal management.

Figure 5B:
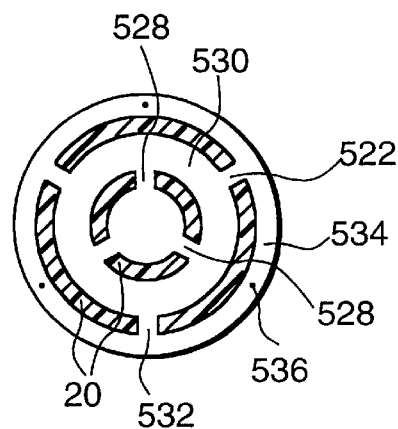
FIGS. 5a, 5b, and 5c are top views of other floating pad embodiments.
Figure 5A:
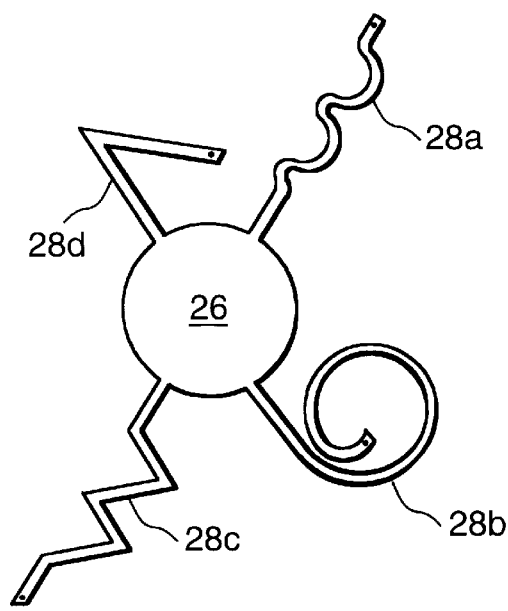
Figure 5C:
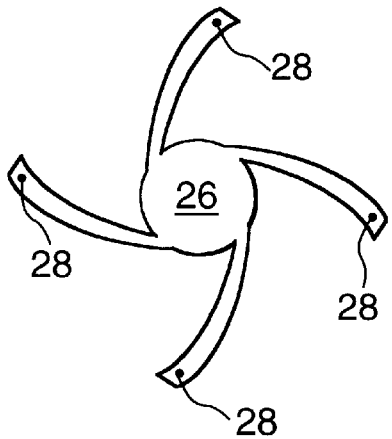

FIGS. 5a, 5b, and 5c are top views of other floating pad embodiments. The patterning of the floating pad structure metallization shown in FIG. 4 was shown for purposes of example only. Any number of extensions (one or more) can be used, and the extensions need not be straight. As shown in FIG. 5a, serpentine shaped extension 28a, spiral extension 28b, saw-tooth extension 28c, and bent extension 28a represent potential shapes for purposes of example. As shown in FIG. 5b, central pad 526 can be surrounded by extensions 528 which extend to a ring 530 which may in turn have additional extensions 532 extending to another ring 534 having vias 536 extending to base metallization 18 (not shown in FIG. 5b). As shown in FIG. 5c, extensions 28 can be curved to form a pin-wheel shaped floating interface pad. The shapes of FIGS. 5a, 5b, and 5c can be useful for reducing mechanical stress on the extensions and are especially useful if base surface 10 is not planar. When selecting an extension shape, consideration of any resulting inductance effects is appropriate.

Figure 6:
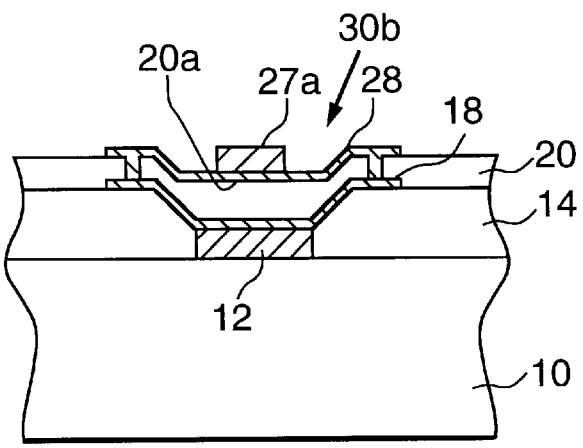
FIG. 6 is a sectional side view of another floating pad embodiment.

FIG. 6 is a sectional side view of another floating pad embodiment that can be useful for reducing mechanical stress on extensions. In FIG. 6, first interface dielectric layer 20 has a dip portion 20a which can be formed during application of the first interface dielectric layer, can be etched from the first interface dielectric layer in a separate step, or can be heat-pressed into shape. When metallization for floating pad interface structure 30b is applied, extensions 28 will then have dips for stress relief. Additional metallization area 27a can be applied to bring the metallization of the central pad up to or above the level of the extensions. Although not shown, the embodiments of FIGS. 3a and 3b are expected to have some natural dips resulting from the application of the metallization of the floating pad structures.

Figure 7:
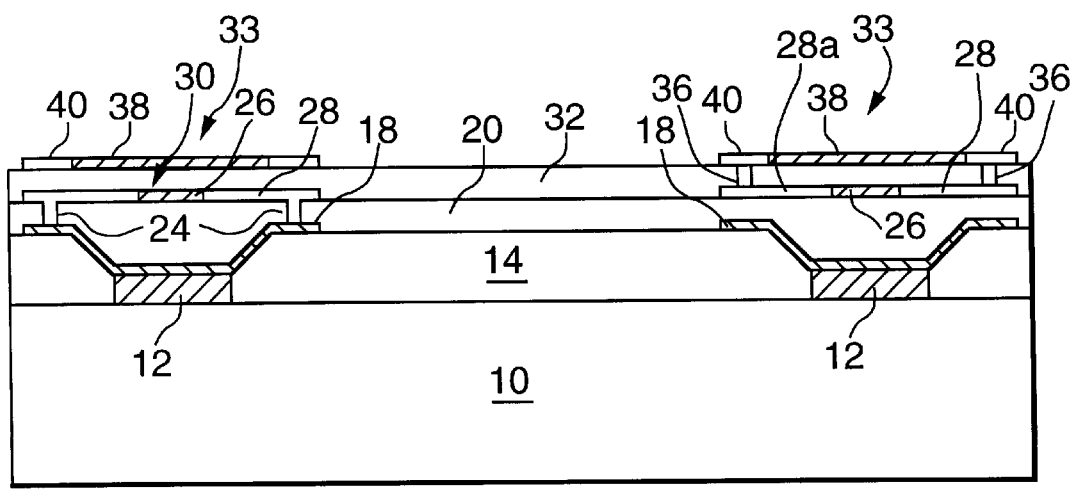
FIG. 7 is a view similar to that of FIG. 3a further including a second interface dielectric layer and a second pair of floating pad structures overlying the first interface dielectric layer.
Figure 8:
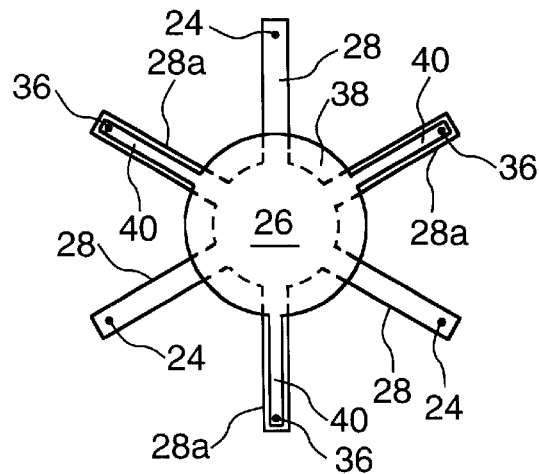
FIG. 8 is a top view of one of the second pair of floating pad structures.

FIG. 7 is a view similar to that of FIG. 3a further including a second interface dielectric layer 32 and a second pair of floating pad structures 33 overlying first interface dielectric layer 20, and FIG. 8 is a top view of one of the second pair of floating pad structures 33.

In this embodiment, each of the first pair of floating pad structures is patterned to have some extensions 28 coupled through vias 24 to base metallization layer 18 and other extensions 28a which are not coupled to the base metallization layer.

Second interface dielectric layer 32 may comprise a material similar to that of first interface dielectric layer 20 which is patterned to include vias 36 extending to extensions 28a that are not coupled directly to the base metallization layer. The second floating pad structure 33 likewise can be fabricated with central pads 38 and extensions 40 in a manner similar to the first pair of floating pad structures 30.

Although, for purposes of simplicity FIG. 3a illustrates a single layer floating interface embodiment and FIG. 7 illustrates a double layer floating interface embodiment, further layers of floating interface structures can be added. Such additional layers are useful for providing greater stress accommodation when a single or double floating pad layer is not sufficient for extreme cases of thermal stress or strain. Multiple layer interface embodiments create additional thermal-mechanical isolation because the floating pad structures are farther away and provide a compound lever and thus more degrees of physical freedom.

Figure 9:
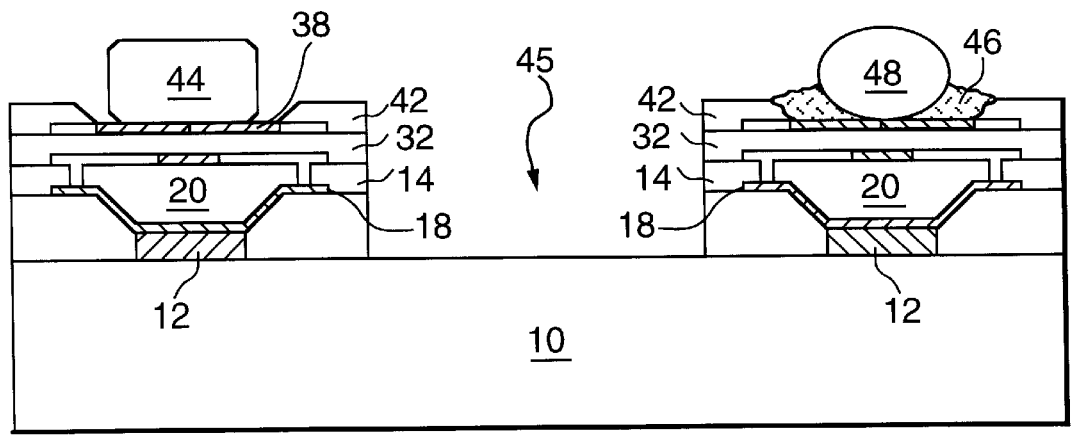
FIG. 9 is a view similar to that of FIG. 7 further including a third interface dielectric layer having openings over the second floating pad structures for positioning of a solder bump and a solder ball and showing excess dielectric material removed.

FIG. 9 is a view similar to that of FIG. 7 further including a third interface dielectric layer 42 having openings over the second floating pad structures for positioning of a solder bump 44 and a solder ball 48 in solder flux 46 and showing excess dielectric material removed in an area 45. Removing the excess dielectric material helps to eliminate stress buildup over the surface area (which can cause bowing or warping) and provides increased compliance and flexibility. Dielectric material can be removed by any of a number of techniques such as a photoresist and etch step, mechanical milling, or laser ablation, for example.

Figure 10:
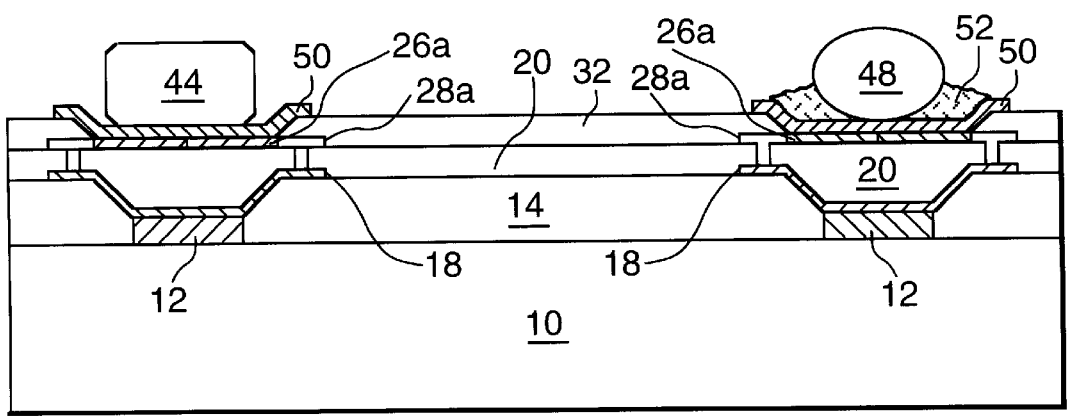
FIG. 10 is a view similar to that of FIG. 3a further showing a second interface dielectric layer having vias with metallization for attachment of a solder bump and solder ball.

FIG. 10 is a view similar to that of FIG. 3a further showing a second interface dielectric layer 32 having vias with metallization 50 for attachment of a solder bump 44 and solder ball 48. Metallization 50 can be applied in a similar manner as the metallization 18. In one embodiment metallization 50 comprises a nickel-gold alloy which creates an improved contact for soldering. The application of interface dielectric layer 32 and metallization 50 can be an alternative to the use of metallization area 27 (shown in FIG. 3a) to increase the thickness of the central pad contact area.

Figure 11:
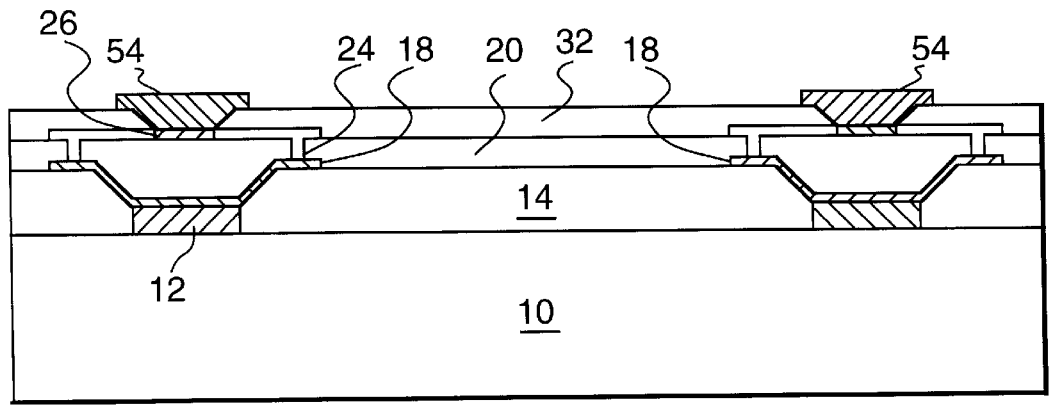
FIG. 11 is a view similar to that of FIG. 3a further showing a second interface dielectric layer having vias in which solder is present.

FIG. 11 is a view similar to that of FIG. 3a further showing a second interface dielectric layer 32 having vias in which solder 54 is present. Solder can be applied by techniques such as metal screening, heat reflow, sputtering, or electroplating, for example. In the embodiment of FIG. 11, second interface dielectric layer 32 may comprise a material such as a polyimide or a solder mask.

Figure 12:
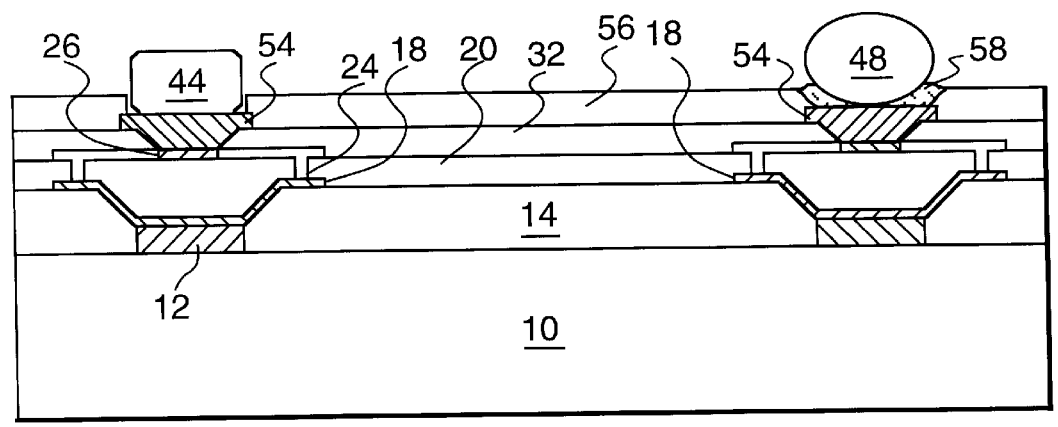
FIG. 12 is a view similar to that of FIG. 11 further including a third interface dielectric layer having openings over the solder for positioning of a solder bump and a solder ball.

FIG. 12 is a view similar to that of FIG. 11 further including a third interface dielectric layer 56 having openings over the solder for positioning of a solder bump 44 and a solder ball 48. Third interface dielectric layer 56 may comprise a material such as a polyimide or a solder mask and is useful for maintaining solder 54 during solder bump or ball attachment. If desired, first, second, and third interface dielectric layers 20, 32, and 56 can be removed entirely, as discussed with respect to first interface dielectric layer 20 of FIG. 3b or in selected locations (along with compliant coating 14, if desired), as discussed with respect to FIG. 9.

With the present invention, MEMS, photonic devices, liquid crystal structures, and semiconductor chips such as silicon, gallium arsenide, and silicon carbide chips, for example, can be directly soldered to various substrate materials such as ceramics, polymers, and flexible interconnect layers, for example, with high reliability over a broad temperature range. Additionally, repair can be performed by heating and melting the solder without having the conventional step of reconfiguring chip pads to a central location.

Figure 13:
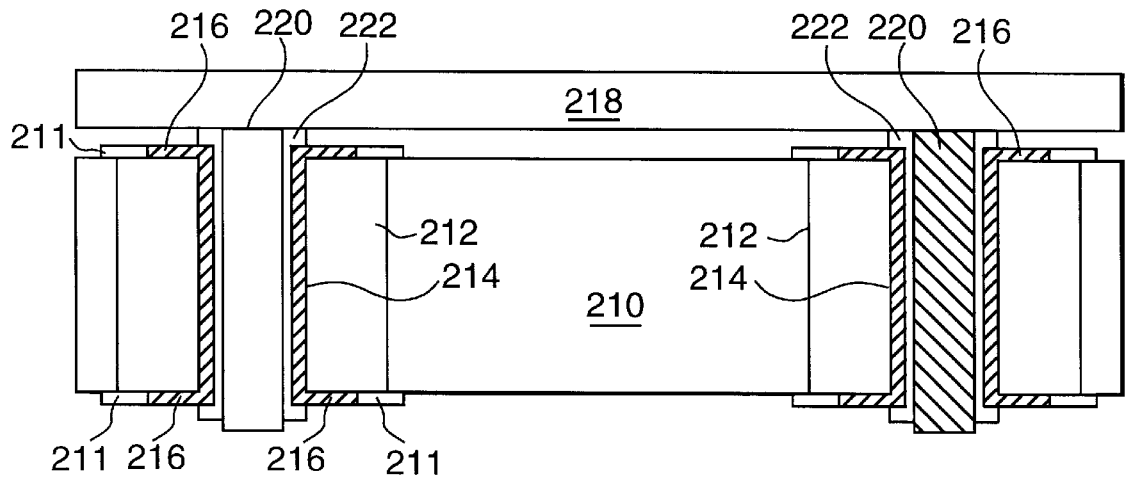
FIG. 13 is a sectional side view of an interface structure for a floating pin contact.
Figure 14:
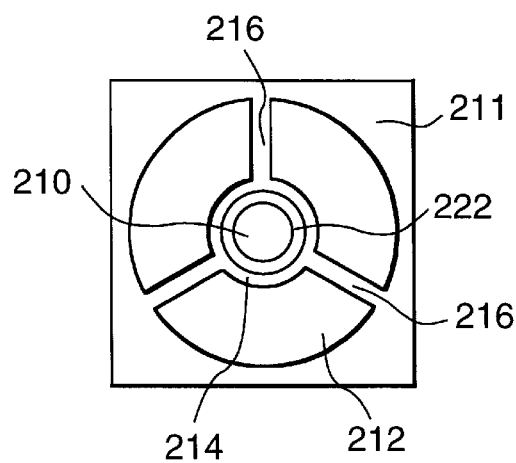
FIG. 14 is a top view of one of the pins of FIG. 14.

FIG. 13 is a sectional side view of an interface structure for a floating pin contact, such as may be present in a pin grid array (PGA) device, and FIG. 14 is a top view of one of the pins of FIG. 14. Coupling rigid pin connection structures to PC boards can create mechanical stresses during fabrication and operation similar to those stresses created when bonding semiconductor chip pads to a substrate. Microprocessor chips can create high temperatures which create large CTE differentials between the chips and PC boards on which they are attached.

In FIGS. 13 and 14, a substrate 210 may comprise a PC board, a flexible interconnect layer, or any other structurally appropriate material. Low modulus interface dielectric regions 212 may comprise materials similar to those discussed with respect to first interface dielectric layer 20 of FIG. 2. The interface dielectric regions 212 can be coated with metallization 214 which covers holes in the interface dielectric regions and has extensions 216 extending therefrom on each surface of substrate 210. Preferably, the metallization is patterned to form extensions extending to a pad interconnect region 211 which is coupled by metallization runs to other pad interconnect regions or metallization areas (not shown) of the substrate. Solder 222 can be applied between the metallization and an electrically conductive pin 220 that is attached to a support structure 218. "Floating" through hole structures result because the interface dielectric regions and extensions permit the substrate to adjust to mechanical stresses to differing coefficients of thermal expansion and mechanical stresses encountered when inserting and removing pin grid arrays and other pin devices.

Although the holes are shown in FIG. 13 as extending through the interface dielectric regions, the invention is also useful in situations wherein the holes extend only part of the way through the interface dielectric material.

Figure 14A:
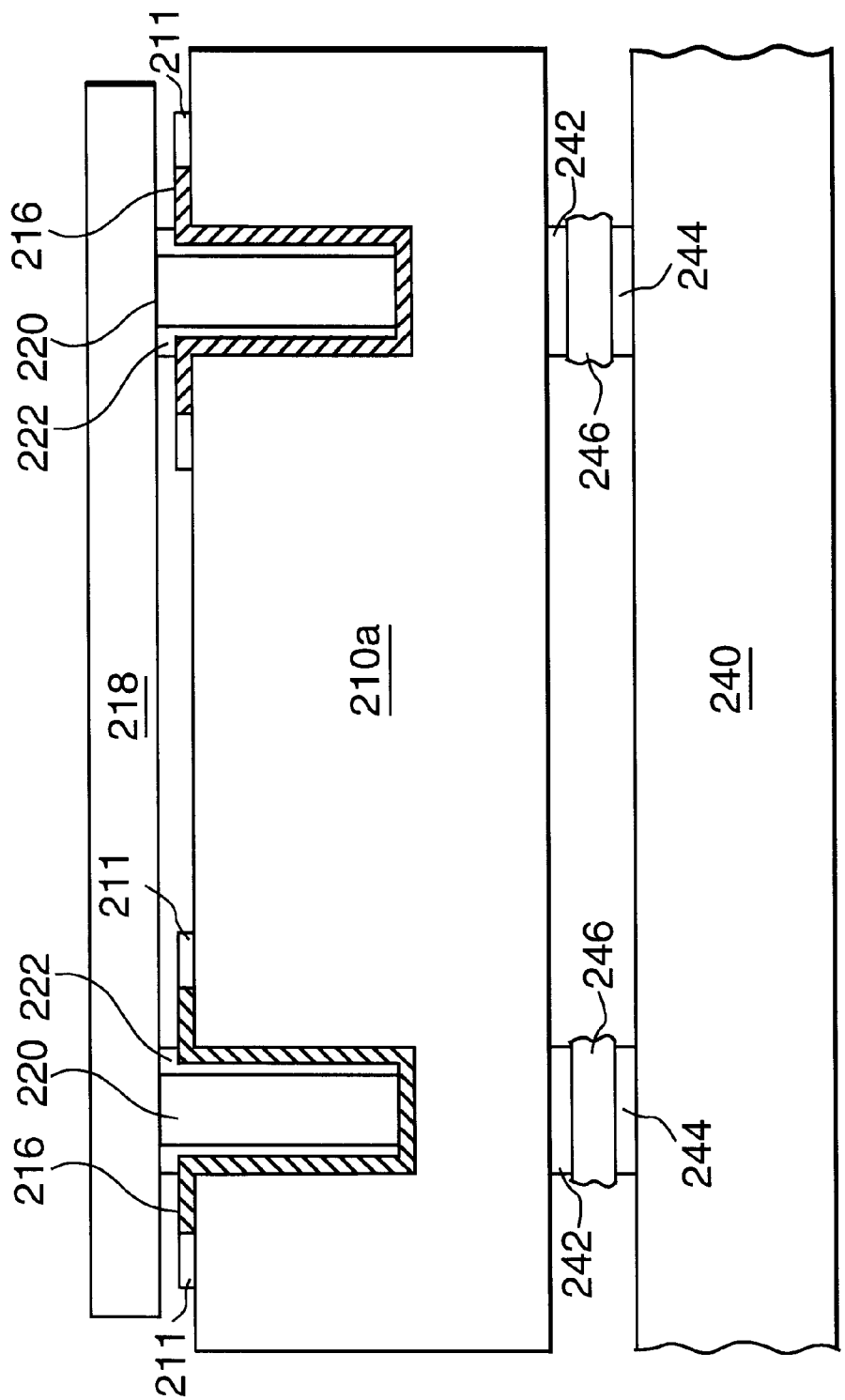
FIG. 14a is a sectional side view of an interface structure wherein holes do not extend all the way through an intermediate substrate.

FIG. 14a is a sectional side view wherein holes do not extend all the way through an intermediate substrate 210a. FIG. 14a also illustrates an embodiment wherein the entire substrate comprises a low modulus dielectric region. The substrate in FIG. 14a is useful as a coupling board between a PC board 240 and a chip having pins, for example. Intermediate substrate 210a has intermediate pads 242 which can be coupled by internal metallization to pads or other metallization on an opposing surface (not shown) of the intermediate substrate and can be coupled by solder 246 to pads 244 of a PC board 240, for example.

Figure 15:
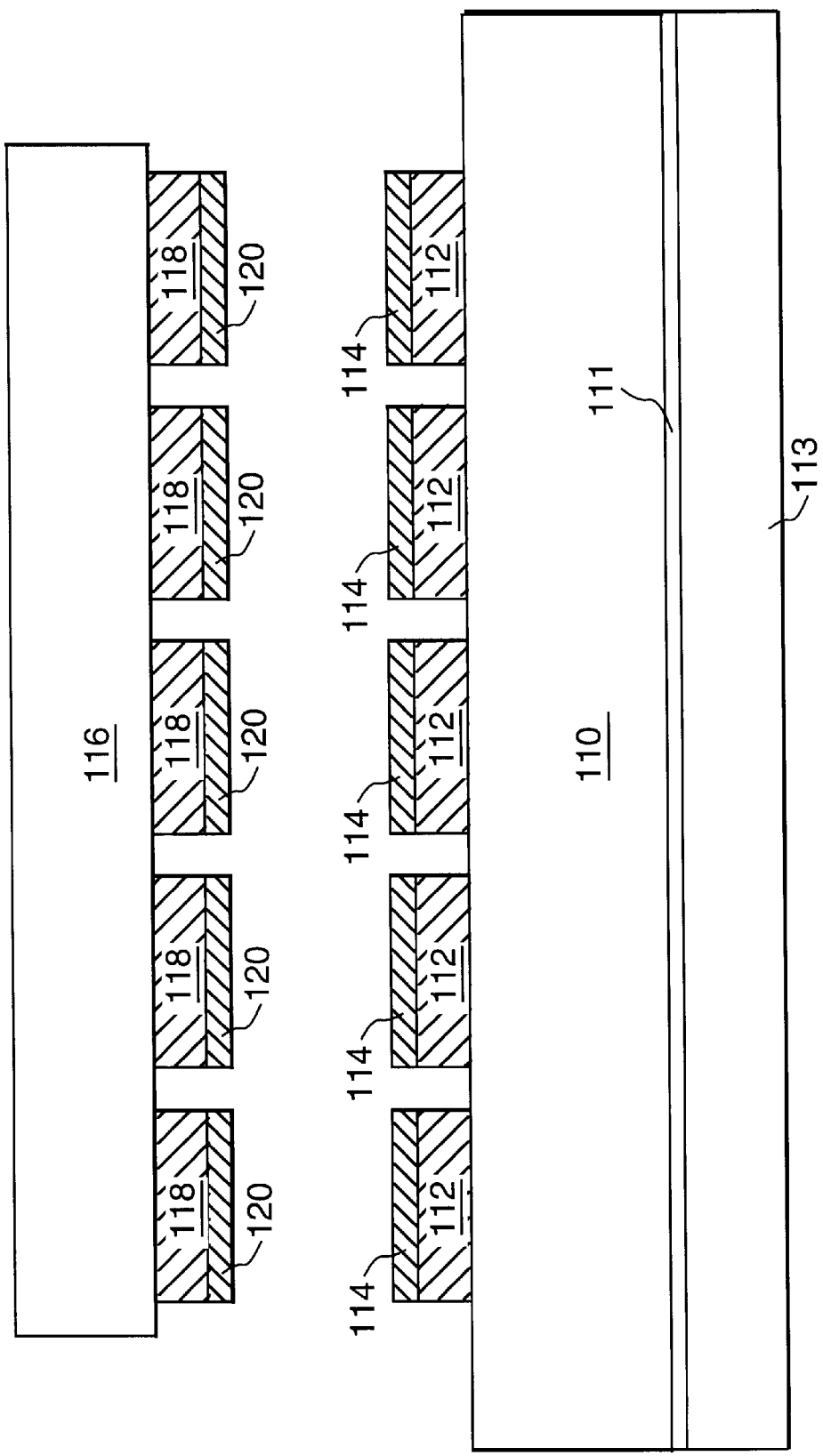
FIG. 15 is a sectional side view of a printed circuit board and a multichip module each having area array pads.

FIG. 15 is a sectional side view of a first surface represented by a printed circuit (PC) board 110 having first contact areas represented by array pads 112 which are coated with solder 114 and a second surface represented by a multichip module (MCM) 116 having second contact areas represented by array pads 118 which are coated with solder 120 and substantially aligned with respective array pads 112.

Although array pads on a PC board and MCM are shown, the present invention is useful for coupling any of a number of metal areas. Other types of metal contact areas wherein the present invention can be useful include, for example, metallization runs on substrates, metallized substrates, flexible interconnect structures, circuit chip pads, semiconductor wafer chip pads, infra red sensors, and holographic arrays.

If a surface such as PC board 110 is a heat sink, includes a heat sink, or is attached to a heat sink 113 by an adhesive 111 (as shown in FIG. 15), the interface structures can create a thermal path that can be used to remove heat from an MCM.

Figure 16:
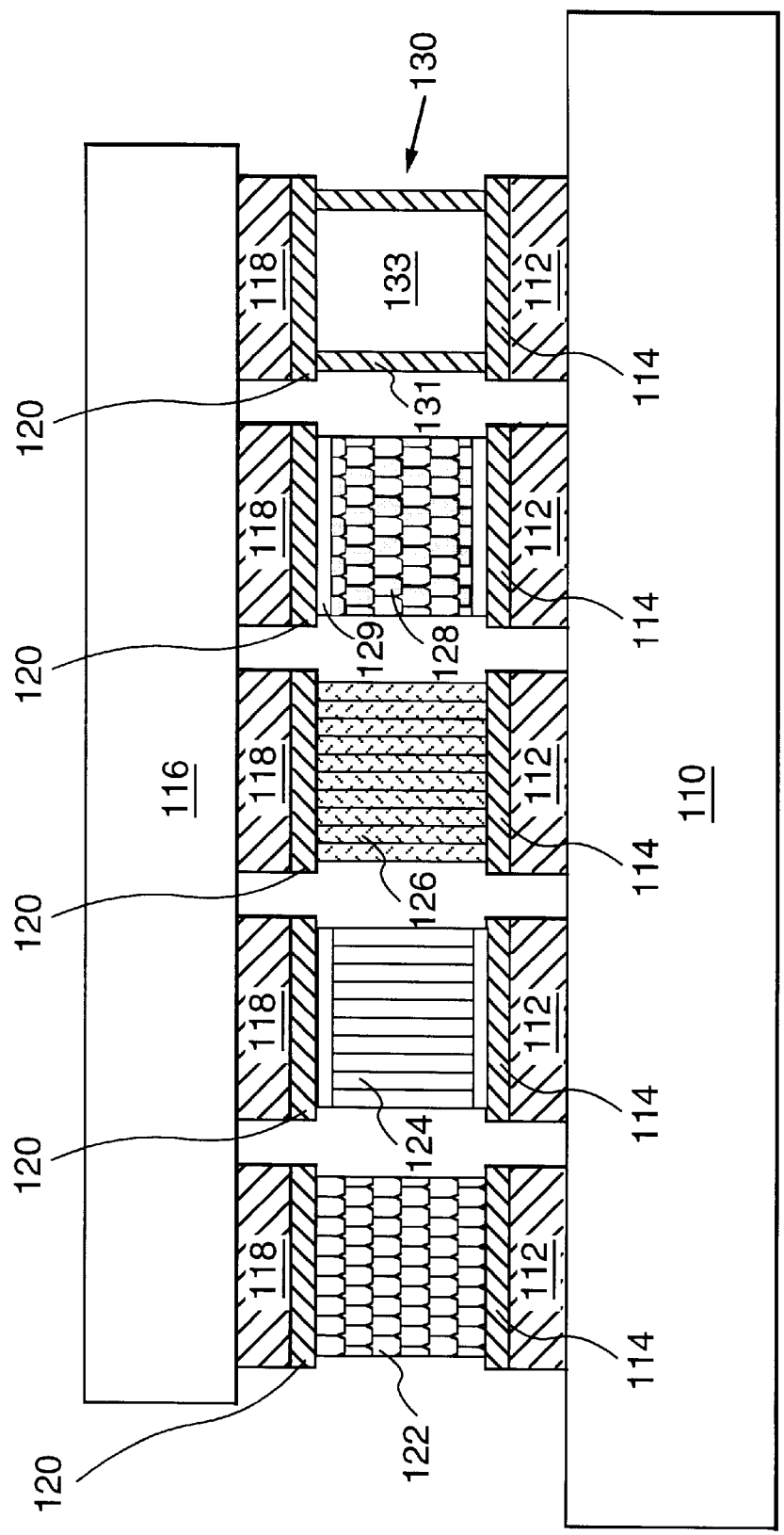
FIG. 16 is a view similar to that of FIG. 15 further including several interface embodiments of the present invention.

FIG. 16 is a view similar to that of FIG. 15 further including several interface structures of the present invention. Each of the interface structures has partially open interior to form a compliant joint between contact areas that it couples. "Partially open interior" means an interior that includes air (open spaces) or a compliant material in addition to the metal that is used to electrically couple the contact areas.

One such interface structure is represented by a crushed wire assembly 122 which can be fabricated by pressing very fine metal wires into a structure having an appearance similar to that of steel wool and which intrinsically has spring action in several planes. Such wire assembly interface structures are available from Cinch Connector Devices, of Elk Grove Village, Ill., under the trademark name of FUZZ buttons. Wire paths are of lower inductance than BGA and CGA, so the size of power drivers for the electronics can be reduced.

Wire assembly 122 may comprise materials such as copper, gold, beryllium copper, gold-plated beryllium copper, and precious metal alloys such as palladium gold alloys. Typically the thickness of the wires range from about 0.5 mil to about 20 mils. A single compressed wire or a plurality of pressed wires can be used for a crushed wire assembly. For standard die pads which range from three to seven mils a diameter of wire assembly 122 would be about 3 mils. Wire assembly 122 can have any shape that permits coupling of two metal areas. For example, round, cylindrical, hour glass, and rectangular shapes are also appropriate for the wire assembly.

Another interface structure is represented by a stranded core wire assembly 124 which includes stranded vertical wires surrounded by insulation. In one embodiment the wires comprise fine copper insulated wires. The insulation must be a material that can withstand the temperatures at which soldering will occur.

One example material is TEFLON™ polytetrafluoroethylene. The wires can be bundled together with insulation and inserted between the two metal areas. If the wires are not exposed at the ends of the interface, a solvent dip, mechanical grinding, or etch process can be used to expose them. Because of the insulation, solder will not appreciably wick into the stranded core wire assemblies.

Another interface structure is represented by a stranded core wire assembly 126 having removable insulation comprising a material such as a dissolvable polymer or a wire varnish. The use of sublimatable insulation is analogous to transformer insulating varnish which can be removed by sublimation or solvents, for example, after soldering is completed. As discussed below, when the insulation is removed from the vertical wires, an enhanced flexible structure is created.

Another interface structure is represented by a crushed wire assembly 128 having capped ends 129. Crushed wire can have an uneven surface which can be evened out by caps comprising solder or a metal for facilitating soldering of the interface to the contact areas. Crushed wire assemblies can also include removable insulation or solder resist if desired to further inhibit solder wicking into crushed wires. Such solder wicking would reduce the flexibility of interfaces.

Another interface structure is represented by a compliant column 130. Column 130 comprises an outer layer of metallization 131 surrounding an inner area which may comprise a flexible material, one example of which is a polymer such as a rubber, or a hollow area. To provide a hollow inner area 133, material can be initially present during fabrication and later removed by a process such as sublimation or diffusion. In this embodiment one or more openings (not shown) would be needed in the outer layer of metallization to facilitate inner material removal.

Figure 17:
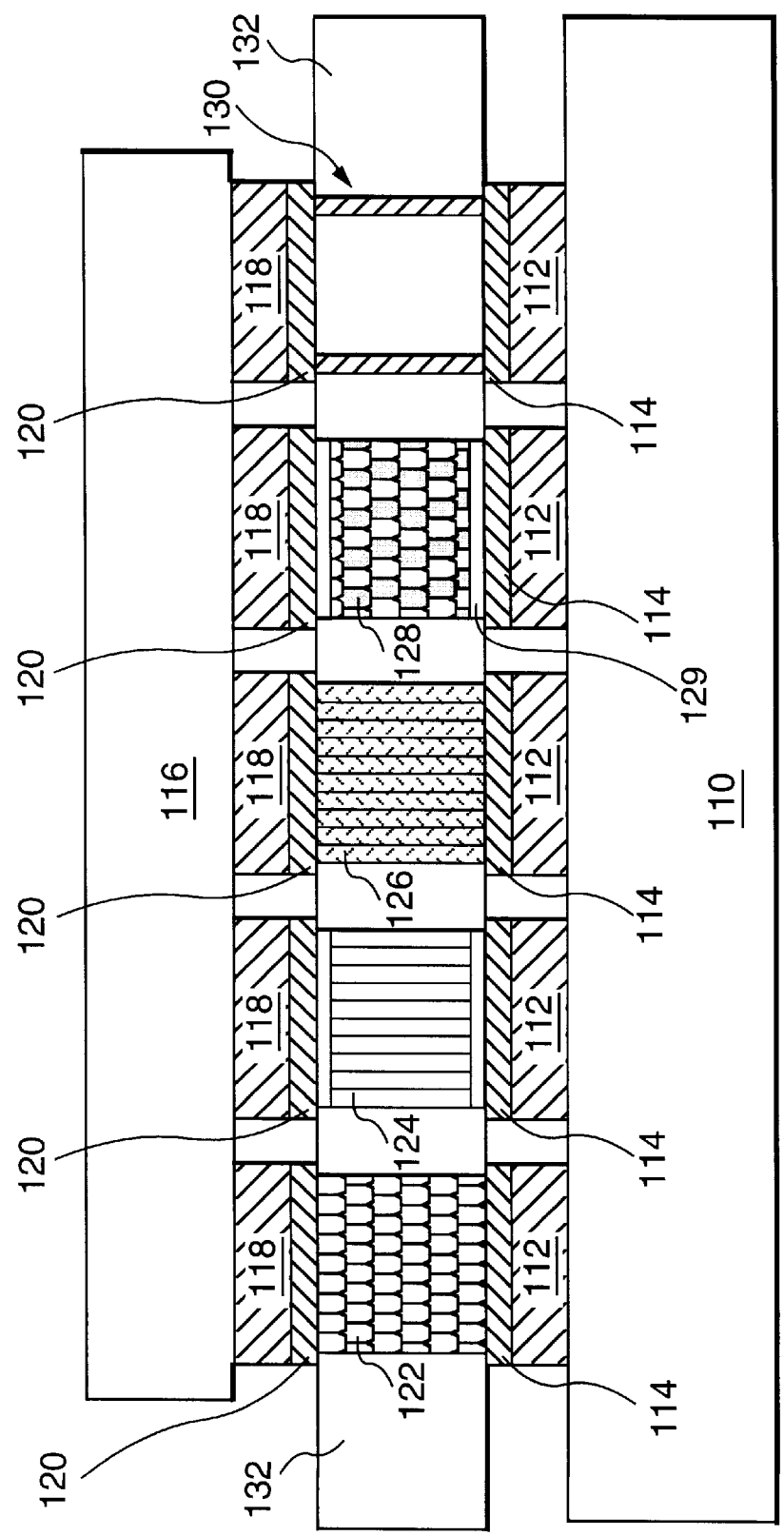
FIG. 17 is a view similar to that of FIG. 16 further including an interposer embodiment of the present invention.

FIG. 17 is a view similar to that of FIG. 16 further including an optional interposer structure 132. The interposer is useful for holding the interface structures in position during soldering. The interposer can be either left in position after soldering or removed. If the interposer structure will be removed, a material such as wax or a polycarbonate which will dissolve or decompose in a solvent is useful. If the interposer structure will remain, any structurally appropriate material which can withstand the fabrication and operating temperatures of the assembly can be used. Examples include printed circuit boards and hard or hard filled plastics such as polyphenylene sulfide.

Figure 18:
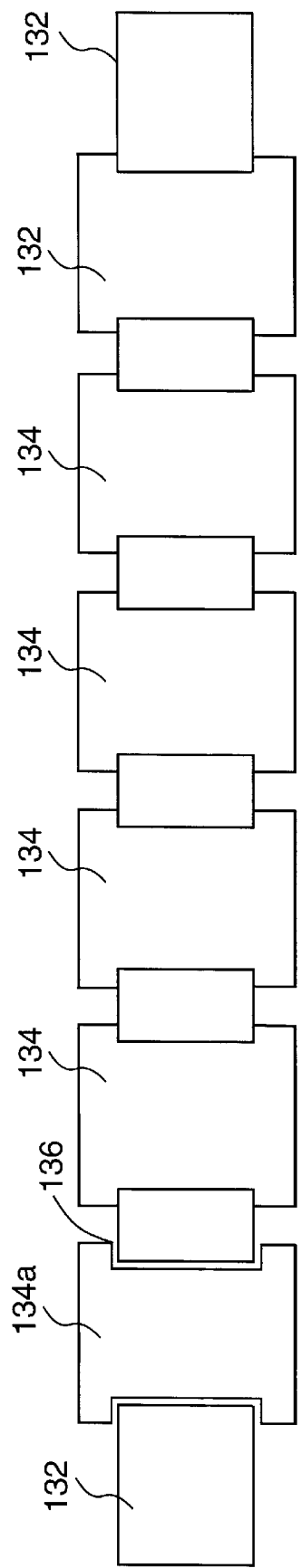
FIG. 18 is a schematic side view of the interface and the interposer.

FIG. 18 is a schematic side view of interface structures 134 and interposer structure 132. In one embodiment, rivet-like shapes of the interface structures are formed so that portions of the interface structures extend over the interposer structure to prevent the interface structures from falling out of the interposer structure. The rivet shapes can be formed in any conventional manner such as by pressing, for example.

A loose fit rivet 134a which can move horizontally and/or vertically can be useful for reducing stress on the interposer structure and contact areas during high temperature operations, providing flexibility for solder to move interfaces in alignment with contact pads, and providing flexibility for curved surfaces. In one embodiment for creating a loose fit, the interposer structure is dipped in a material that can be dissolved in a solvent, the interface structures are inserted in the interposer structure, the rivets are created, and the interposer structure is dipped in a solvent for removing the dipped material.

As discussed with respect to interface structures 126 and 128 of FIG. 16, the interface structures can be modified by filling them with an insulative substance that prevents solder wicking into the crushed or vertically stranded wires. If the solder wicks deeply enough into the interfaces, a solid inflexible structure can result and would not provide effective CTE thermal stress accommodation.

The insulative material may be added by a method such as dipping and comprise a polymer that can be dissolved in an appropriate solvent or any of a variety of organic and inorganic materials that can be removed by any of a number of techniques. A heat sublimation technique is described in Wojnarowski et al., U.S. Pat. No. 5,449,427, issued Sep. 12, 1995, for example.

After assembly, the insulative material may be removed, if desired, by any of a number of techniques such as sublimation, solvents, thermal decomposition, and the like to increase the spring-like compliance of the interface structures.

Figure 19:
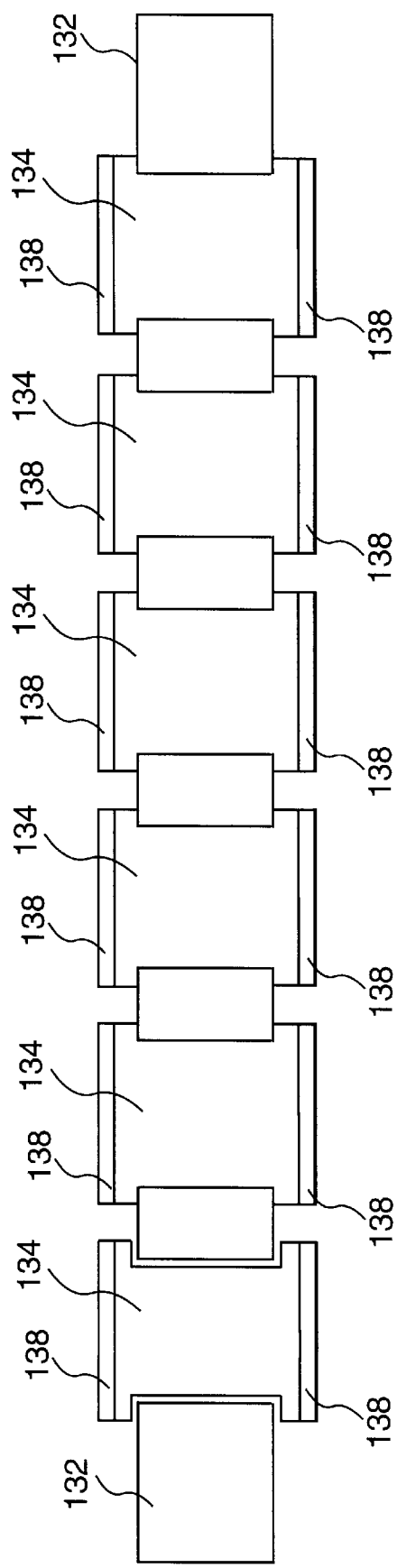
FIG. 19 is a view similar to that of FIG. 18 further including solderable surfaces on the interface.

FIG. 19 is a view similar to that of FIG. 18 further including solderable surfaces 138 on the interface. The top and bottom areas of the interfaces can be chemically treated or mechanically ground to reveal a solderable interface. Plasmas, RIE (reactive ion etching), solvents, flame treatments, or mechanical grinding, for example, can be used to expose desired areas of the rivet buttons. An optional step of pre-tinning an interface structure surface by dipping it in solder or metallizing it by electroless metallization can facilitate soldering of the interface surface to the contact area and help the surface tension of the solder to move the interfaces into alignment with the contact pads.

Repair can be accomplished by heating the interfaces and melting the solder. If no insulating material is present (either there never was any or any such material was removed), the solder wicks away from the solder joint and into the interface structures and thus the excess solder is removed from the repair area without requiring rework by hand.

Figure 20:
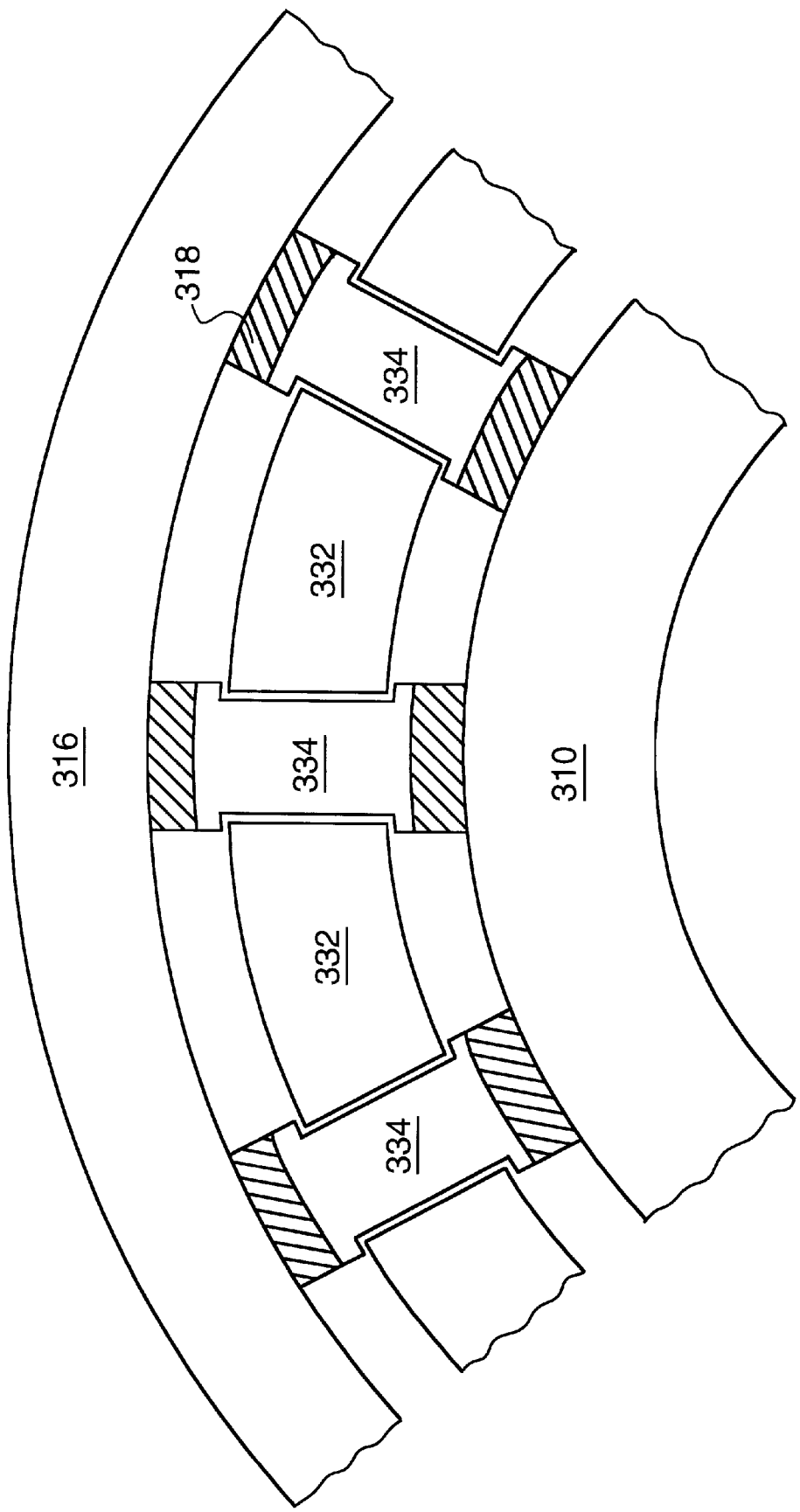
FIG. 20 is a view similar to that of FIG. 17 showing a curved base.

The present invention can be used as a planarization technique to assemble non-flat parts. This is useful because surfaces such as PC boards are not always flat and because surfaces to be interconnected may be curved, for example. FIG. 20 is a view similar to that of FIG. 17 showing a curved base 310 with pads 312 coupled to pads 318 of surface 316 by interfaces 334 loosely fit into an interposer 332.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. An interface comprising:
   a base surface having an electrically conductive base pad;
   a compliant coating over the base surface and base pad, the compliant coating having a coating via extending therethrough to the base pad;
   base metallization patterned over the compliant coating and extending into the coating via;
   a low modulus dielectric interface layer overlying the compliant coating and having at least one dielectric interface via extending therethrough to the base metallization; and
   a floating pad structure comprising floating pad metallization patterned over the dielectric interface layer, a first portion of the floating pad metallization forming a central pad and a second portion of the floating pad metallization forming at least one extension from the central pad and extending into the at least one dielectric interface via, the floating pad structure capable of accommodating thermal and material stresses and permitting movements of the central pad independent of the base pad.

2. The interface of claim 1 wherein the base surface comprises a semiconductor chip, a passive component, a semiconductor wafer, a printed circuit board, a flexible interconnect layer structure, a photonic structure, a liquid crystal structure, or a microelectromechanical structure (MEMS).

3. The interface of claim 2 wherein the dielectric interface layer comprises a flexible epoxy or a flexible rubber.

4. The interface of claim 1 wherein the floating pad metallization includes at least two extensions from the central pad and wherein the dielectric interface layer has at least two dielectric interface vias therein, each extension extending into a respective dielectric interface via.

5. The interface of claim 4 wherein the central pad has a thickness greater than a thickness of the at least two extensions.

6. The interface of claim 4 wherein, above the base pad, the levels of the dielectric interface layer and the floating pad metallization dip.

7. The interface of claim 4 wherein the floating pad metallization further includes at least two noncoupling extensions, the at least two noncoupling extensions not extending into dielectric interface vias; and further including
an additional dielectric interface layer overlying the floating pad structure and having additional vias extending therethrough to the at least two noncoupling extensions; and
an additional floating pad structure comprising additional floating pad metallization patterned over the additional dielectric interface layer, a first portion of the additional floating pad metallization forming an additional central pad and a second portion of the additional floating pad metallization forming additional extensions from the central pad and extending into respective ones of the additional vias.

8. The interface of claim 4 wherein a portion of the surface not including the base pad and the floating pad structure is not covered by the compliant coating and the dielectric interface layer.

9. The interface of claim 4 wherein a solder ball or solder bump is attached to the central pad of the floating pad structure.

10. The interface of claim 4 further including:
an additional dielectric interface layer overlying the floating pad structure and having an additional via over the central pad, and
contact metallization patterned over the additional dielectric interface layer and extending into the additional via.

11. The interface of claim 10 further including a solder ball or solder bump attached to the contact metallization.

12. The interface of claim 4 further including:
an additional dielectric interface layer overlying the floating pad structure and having an additional via over the central pad, and
solder patterned over the additional dielectric interface layer and extending into the additional via.

13. The interface of claim 12 wherein the additional dielectric interface layer comprises a solder mask.

14. The interface of claim 12 further including a second additional interface dielectric layer overlying the additional interface dielectric layer and having second additional vias over the solder.

15. The interface of claim 4, wherein the interface dielectric layer has an open area situated under at least a portion of the floating pad structure.

16. An interface comprising:
a base surface having an electrically conductive base pad;
a compliant coating over the base surface and base pad, the compliant coating having a coating via extending therethrough to the base pad;
base metallization patterned over the compliant coating and extending into the coating via;
a floating pad structure situated above the base metallization and compliant coating and comprising floating pad metallization, a first portion of the floating pad metallization forming a central pad and a second portion of the floating pad metallization forming at least two extensions from the central pad, the at least two extensions being coupled to the base metallization, the floating pad structure capable of accommodating thermal and material stresses and permitting movements of the central pad independent of the base pad.

17. A method for fabricating an interface comprising the steps of:
applying a compliant coating over a base surface having an electrically conductive base pad;
forming a coating via extending in the compliant coating extending to the base pad;
applying and patterning a base metallization over the compliant coating and into the coating via;
applying a low modulus dielectric interface layer over the compliant coating;
forming at least one dielectric interface via extending through the dielectric interface layer to the base metallization; and
applying a floating pad structure comprising floating pad metallization patterned over the dielectric interface layer, a first portion of the floating pad metallization forming a central pad and a second portion of the floating pad metallization forming at least one extension from the central pad and extending into the dielectric interface via, the floating pad structure capable of accommodating thermal and material stresses and permitting movements of the central pad independent of the base pad.

18. The method of claim 17 wherein the at least one dielectric interface via comprises at least two dielectric interface vias and the at least one extension comprises at least two extensions and further including, after applying the floating pad structure, removing the dielectric interface layer.

19. The method of claim 17 wherein the at least one dielectric interface via comprises at least two dielectric interface vias and the at least one extension comprises at least two extensions and further including, after applying the floating pad, removing at least a portion of the dielectric interface layer under the floating pad structure.

20. The method of claim 19 further including the step of filling an area under the floating pad structure wherein the at least a portion of the dielectric interface layer was removed with a filler material.

21. An interface comprising:
a substrate including a low modulus dielectric interface material having at least one hole extending at least partially therethrough; and
a metallized floating pad contact structure comprising electrically conductive material coating the at least one hole, at least some of the metallized floating pad contact structure forming at least one extension from the at least one hole.

22. The interface of claim 21 further comprising:
an electrically conductive pin connected to a support structure and situated in the at least one hole, and
solder coupling the electrically conductive pin and the floating contact structure.

23. The interface of claim 22 wherein the substrate further includes a rigid material surrounding the low modulus dielectric interface material.

24. The interface of claim 22 wherein the substrate comprises a printed circuit board or a flexible interconnect layer structure.

25. The interface of claim 24 wherein the dielectric interface material comprises a flexible epoxy or a flexible rubber.

26. The interface of claim 21 wherein the floating pad metallization includes at least two extensions from the central pad.

27. The interface of claim 21 wherein the at least one hole extends partially through the substrate.

28. The interface of claim 27 wherein the substrate further comprises substrate pad metallization situated on an opposite surface of the at least one hole and further comprising:
   an electrically conductive pin connected to a support structure and situated in the at least one hole;
   solder coupling the electrically conductive pin and the floating contact structure;
   a surface having a surface metallization pad thereon; and
   solder coupling the substrate pad metallization pad and the surface metallization pad.

* * * * *

UNITED STATES PATENT AND TRADEMARK OFFICE
CERTIFICATE OF CORRECTION

PATENT NO. : 5,900,674  
DATED : May 4, 1999  
INVENTOR(S) : Wojnarowski, et al.

Page 1 of 2

It is certified that error appears in the above-identified patent and that said Letters Patent is hereby corrected as shown below:

In the Drawings

SHEET 1 OF 12 OF THE DRAWINGS IS REPLACED BY THE FOLLOWING:

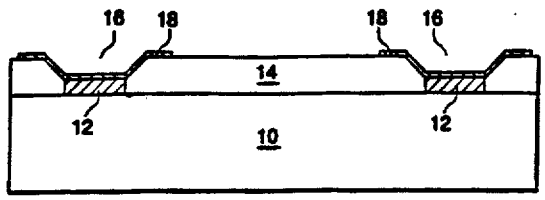

FIG. 1

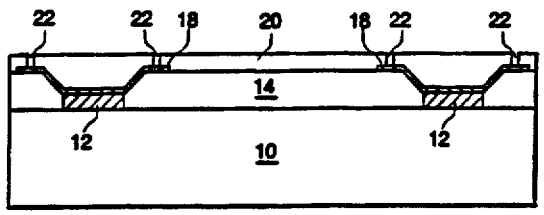

FIG. 2

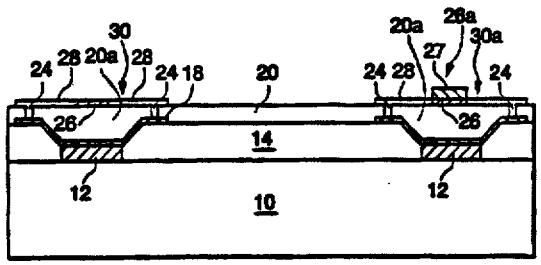

FIG. 3a

UNITED STATES PATENT AND TRADEMARK OFFICE
CERTIFICATE OF CORRECTION

PATENT NO. : 5,900,674
DATED : May 4, 1999
INVENTOR(S) : Wojnarowski, et al.

It is certified that error appears in the above-identified patent and that said Letters Patent is hereby corrected as shown below:

Signed and Sealed this

Eleventh Day of April, 2000

Attest:

Q. TODD DICKINSON

Attesting Officer

Director of Patents and Trademarks